United States Patent [19]
Hebert et al.

[11] Patent Number: 6,091,110
[45] Date of Patent: Jul. 18, 2000

[54] MOSFET DEVICE HAVING RECESSED GATE-DRAIN SHIELD AND METHOD

[75] Inventors: Francois Hebert, San Mateo; Szehim Ng, Campbell, both of Calif.

[73] Assignee: Spectrian Corporation, Sunnyvale, Calif.

[21] Appl. No.: 09/430,530

[22] Filed: Oct. 29, 1999

Related U.S. Application Data

[62] Division of application No. 09/050,859, Mar. 30, 1998, Pat. No. 6,001,710.

[51] Int. Cl.[7] .................................................. H01L 29/78
[52] U.S. Cl. ........................... 257/340; 257/409; 257/630
[58] Field of Search ................................... 257/340, 409, 257/630

[56] References Cited

U.S. PATENT DOCUMENTS

| | | | |
|---|---|---|---|
| 4,455,565 | 6/1984 | Goodman et al. | 257/340 |
| 5,043,790 | 8/1991 | Butler | 357/68 |
| 5,119,149 | 6/1992 | Weitzel et al. | 257/340 |
| 5,162,249 | 10/1992 | Kim | 437/52 |
| 5,216,281 | 6/1993 | Butler | 257/750 |
| 5,243,234 | 9/1993 | Lin et al. | 257/328 |
| 5,252,848 | 10/1993 | Adler et al. | 257/328 |
| 5,821,139 | 10/1998 | Tseng | 438/239 |
| 5,821,144 | 10/1998 | D'Annna et al. | 438/276 |
| 5,841,166 | 11/1998 | D'Annna et al. | 257/335 |
| 5,869,875 | 2/1999 | Hebert | 257/382 |
| 5,912,490 | 6/1999 | Hebert et al. | 257/340 |
| 5,918,137 | 6/1999 | Ng et al. | 257/340 |

*Primary Examiner*—David Hardy
*Attorney, Agent, or Firm*—Townsend and Townsend and Crew LLP; Henry K. Woodward

[57] ABSTRACT

A method of fabricating a MOSFET transistor and resulting structure having a drain-gate feedback capacitance shield formed in a recess between a gate electrode and the drain region. The shield does not overlap the gate and thereby minimizes effect on the input capacitance of the transistor. The process does not require complex or costly processing since one additional non-critical mask is required with selective etch used to create the recess.

6 Claims, 9 Drawing Sheets

MOSFET DEVICE HAVING RECESSED GATE-DRAIN SHIELD AND METHOD

This patent application is a division of application Ser. No. 09/050,859 filed Mar. 30, 1998, now U.S. Pat. No. 6,001,710.

BACKGROUND OF THE INVENTION

This invention relates generally to MISFET (MOSFET) devices having source and drain regions connected by a gate-controlled channel, and more particularly the invention relates to a MOSFET device having a reduced drain-gate feedback capacitance provided by a recessed shield between the gate and drain electrodes.

The MOSFET device has many electrical applications including use as a RF/microwave amplifier. In such an application, the gate to drain feedback capacitance (Cgd or $C_{rss}$) must be minimized in order to maximize RF gain and minimize signal distortion. The gate to drain feedback capacitance is critical since it is effectively multiplied by the voltage gain of the device or $C_{effective} = C_{rss} (1+gm\ R_1)$ where gm is the transconductance and $R_1$ is the load impedance.

Heretofore, Faraday shields have been employed between the gate and drain electrodes in an attempt to minimize the feedback capacitance. Adler et al. U.S. Pat. No. 5,252,848 discloses a MOSFET structure in which a shield is provided over the gate electrode and which terminates over the drain electrode. The shield comprises a polysilicon layer with resistance of 100 ohms/square or less formed over a nitride film over a stress relief oxide formed directly over the gate. The structure is effective, but the fabrication of the device is complex due to the two polysilicon layers which are required. Weitzel U.S. Pat. No. 5,119,149 discloses a gallium arsenide MESFET structure in which a shield conductor is placed between the gate and drain electrodes without overlapping the gate. The gate to drain capacitance is not minimized since the metal electrode is placed over the passivation dielectric material for the gate structure.

The present invention is directed to a fabrication method and resulting MOSFET device which does not require complex or costly processing and which reduces the gate-drain feedback capacitance without any increase in the input capacitance of the device.

SUMMARY OF THE INVENTION

In accordance with the invention, a recess is formed on the surface of a MOSFET device between the gate electrode and the drain which is close to the drain surface without shorting to it. A shield electrode is then formed in the recess to enhance the shielding of the feedback capacitance from the drain to the gate.

More specifically, in accordance with one embodiment of the invention, a stress relief dielectric layer is formed over the source region, the gate electrode, and the drain region of a MOSFET device, and then an inter level dielectric is formed over the stress relief dielectric, the inter level dielectric having a faster etch rate than the stress relief layer. The inter level dielectric is then removed from over a portion of the stress relief layer between the gate electrode and the drain electrode, and a shield electrode is then formed on the exposed portion of the stress relief layer, thereby recessing the shield below the inter level dielectric which overlies the gate electrode.

In accordance with another embodiment of the invention, the inter level dielectric and the underlying stress relief dielectric layer are both removed from a surface portion of the drain region, and a passivation dielectric layer is then deposited over the stress relief layer and the exposed surface portion of the drain region. A shield electrode is then formed on the passivation layer over the previously exposed portion of the drain region to provide a recessed shield electrode between the gate electrode and other drain.

In the resulting structures, a MOSFET device is provided in which a shield electrode is placed between the gate electrode and the drain electrode, but which does not overlap the gate electrode. There is no need for complex or costly processing as only one additional non-critical mask is required, and a selective etch process is used to create a recess for the shield electrode. Since the shield electrode does not overlap the gate or source region, there is no increase in input capacitance of the device.

The invention and objects and features thereof will be more readily apparent from the following detailed description and dependent claims when taken with the drawing

DETAILED DESCRIPTION OF THE ILLUSTRATIVE EMBODIMENTS

Figure 1A:
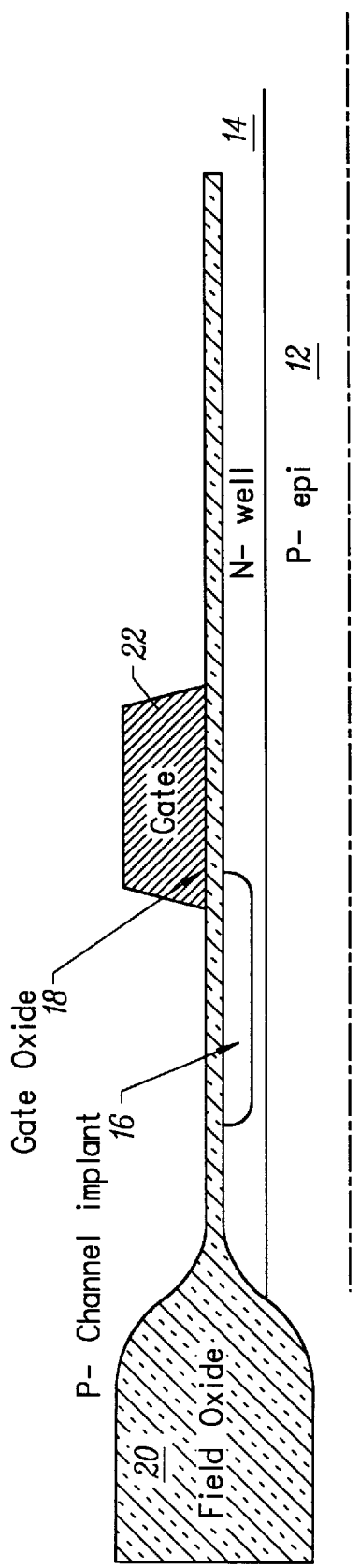
FIGS. 1A–1E are section views illustrating steps in fabricating a MOSFET device having recessed gate-drain shield in accordance with one embodiment of the invention.

The invention will be described with reference to a lateral DMOS transistor, but it is to be understood that the invention is applicable to other MOSFET transistors including an extended drain MOSFET transistor, and a vertical DMOS transistor. FIGS. 1A–1E are section views illustrating process steps in fabricating a lateral DMOS transistor in accordance with one embodiment of the invention. In FIG. 1A, a semiconductor body includes a P+ substrate 10 and a P– epitaxial layer 12 formed thereon. An N-well 14 is formed in the surface of the epitaxial layer 12, and a P-channel implant 16 is formed in a surface portion of the N-well 14. A gate oxide 18 extends from a field oxide 20 across the surface of the N-well with a gate electrode 22 formed on the surface of gate oxide 18. An optional deep sinker can be formed for a grounded source LDMOS device. The N-well 14 of the drain can be formed before the field oxidation or after field oxidation, but must be formed prior to buried shield plate formation. The gate 22 is preferably an N+ doped polycide structure.

Figure 1B:
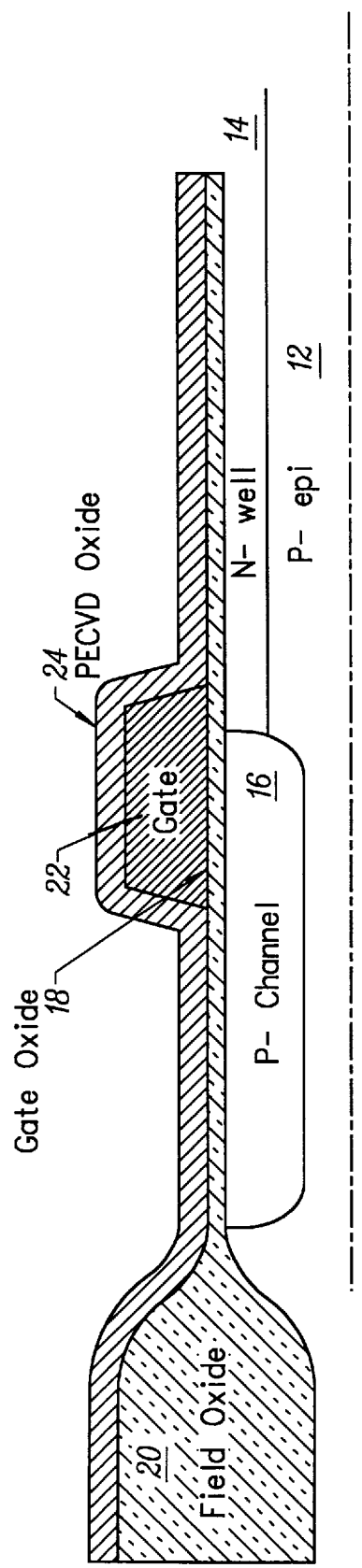
Figure 1C:
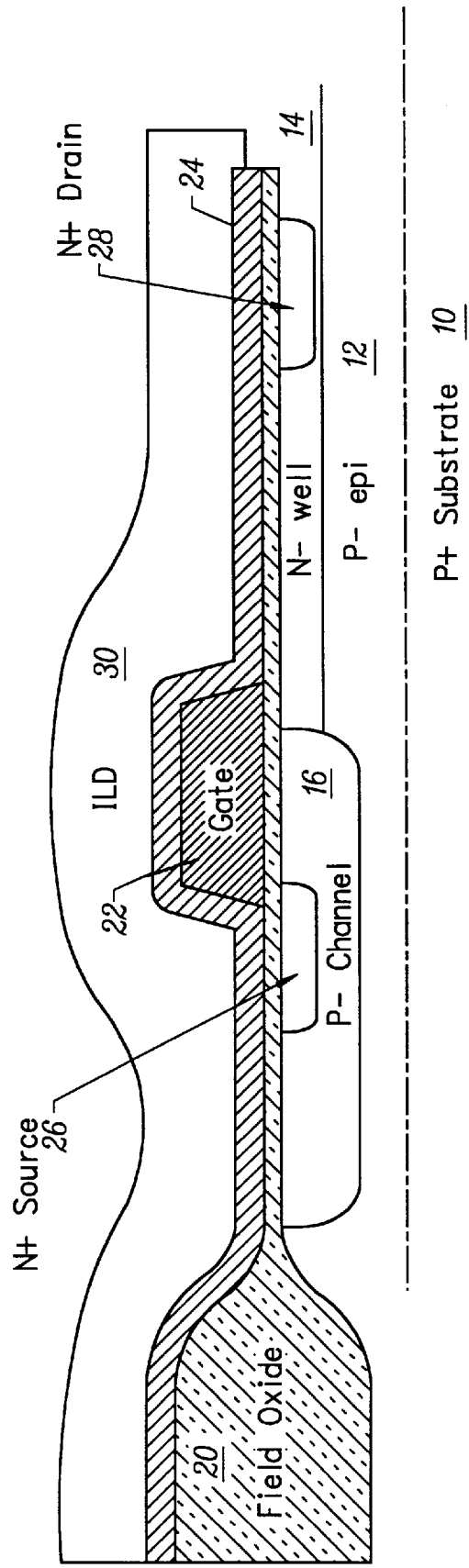

In FIG. 1B, a plasma enhanced CVD oxide layer 24, which has a slower etch rate than thermal oxide, is deposited, and then the device is heated for the P-channel diffusion and the PECVD oxide densification. In FIG. 1C, an N+ source/drain mask is provided and the source 26 and drain 28 are then formed by implant of a dopant such as arsenic. A thick inter level dielectric (ILD) 30 is then formed over the plasma enhanced CVD oxide 24. ILD dielectric 30 is typically a doped oxide such as BPSG to allow for reflow of the doped oxide. The device is then heated for a reflow of the doped oxide and the final N+ drive and anneal.

Figure 1D:
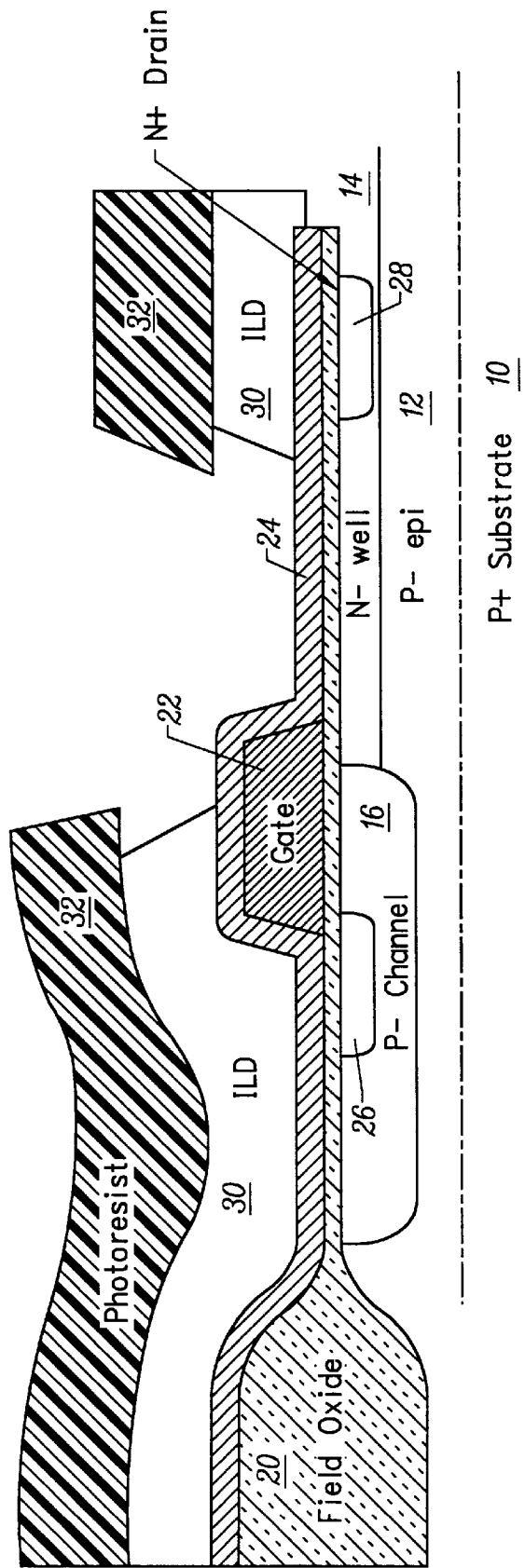

In FIG. 1D, a photoresist layer 32 is used to mask the device and then a wet etch or partial dry etch plus wet etch is applied to remove the ILD layer 30 from over dielectric 24 between gate 22 and N+ drain 28. The etch step stops at the plasma enhanced CVD oxide layer 24 which has a slower etch rate than the reflowed BPSG layer 30.

Figure 1E:
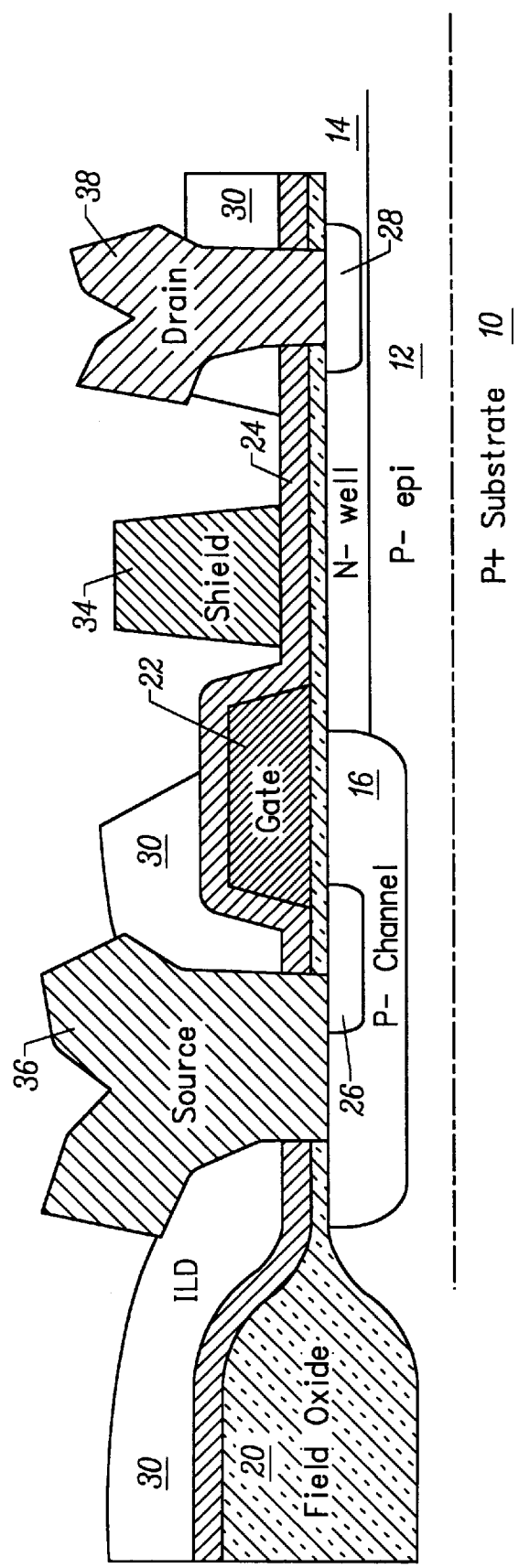

Finally, as illustrated in FIG. 1E, a contact mask is used to etch down to the silicon surface, and then a metal deposition and metal mask and etch are used to form the drain-gate shield electrode 34, a source electrode 36, and a drain electrode 38. In this embodiment, the shield electrode 34 does not overlap the recess, but is confined to a limited area between gate 22 and drain 28.

A number of alternative embodiments to the process of FIGS. 1A–1E are possible. For example, the stress relief layer 24 over the gate electrode can comprise a low pressure chemical vapor deposited nitride or oxynitride layer. Further, a sandwich structure of low pressure chemical vapor deposit (LPCVD) oxide can be provided under the PECVD oxide as a stress relief layer. Alteratively, the sandwich structure can include the LPCVD oxide under the LPCVD nitride as a stress relief layer.

Figure 2A:
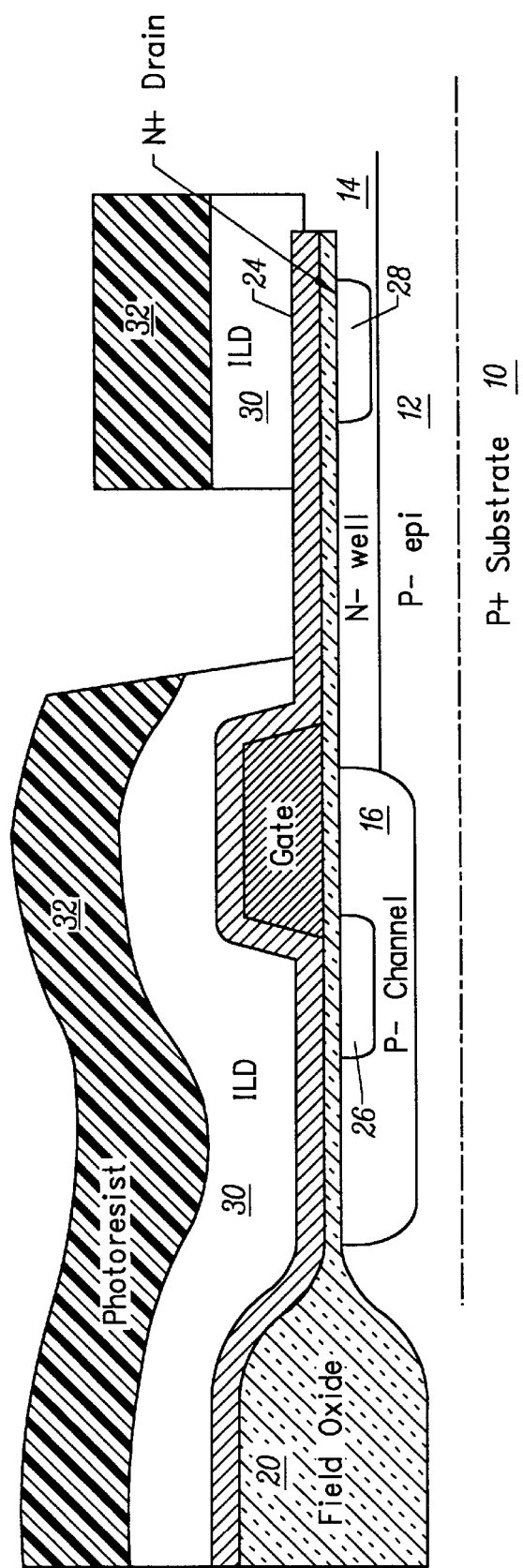
FIGS. 2A and 2B are section views illustrating alternative steps in the process of FIGS. 1A–1E.
Figure 2B:
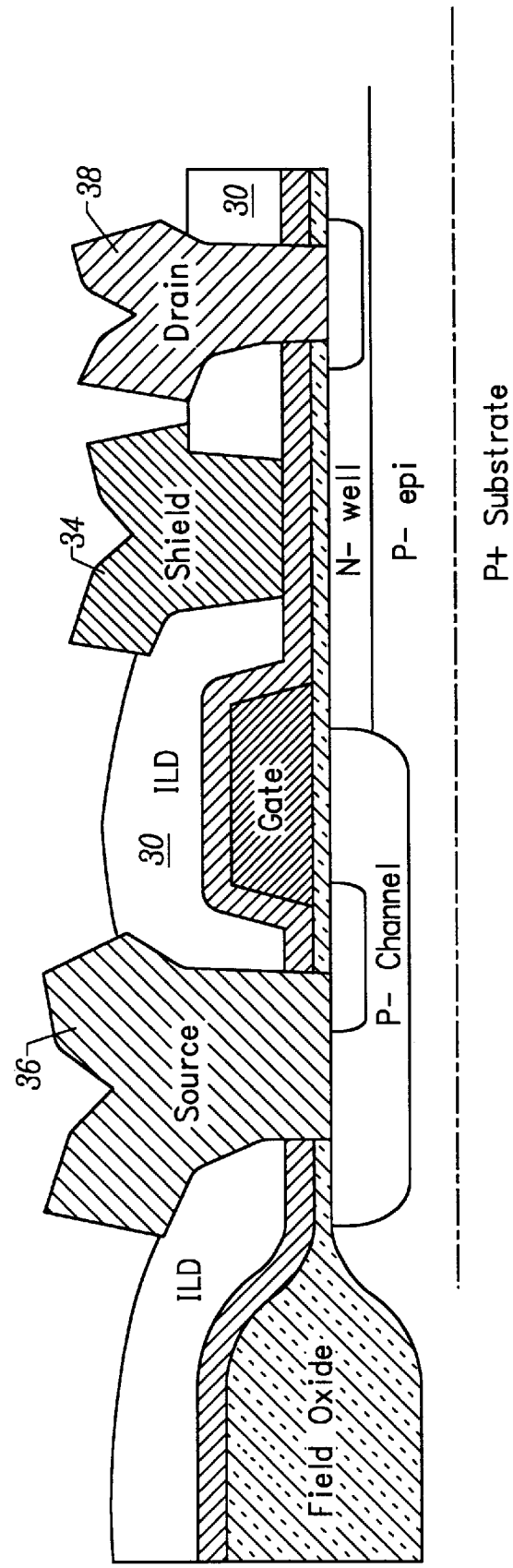

FIGS. 2A and 2B are section views illustrating alterative process steps to the method illustrated in FIGS. 1A–1E. In FIG. 2A, the photoresist layer 32 is removed to limit the etched surface area to above tne N-well 14 without exposing the stress relief layer 24 above the gate 22. Then, as illustrated in FIG. 2B, the shield electrode 34 can overlap the recess and the inter layer dielectric 30 for enhanced shielding.

Figure 3A:
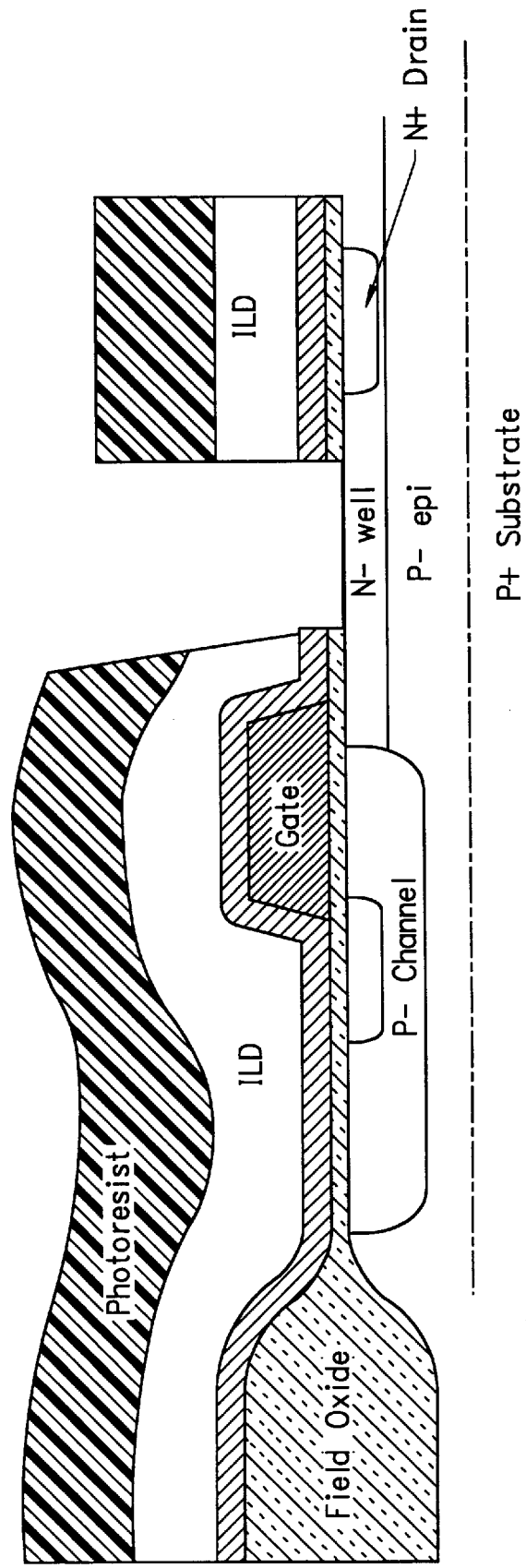
FIGS. 3A–3C illustrate steps in fabricating a MOSFET device having a recessed gate-drain shield in accordance with another embodiment of the invention.
Figure 3B:
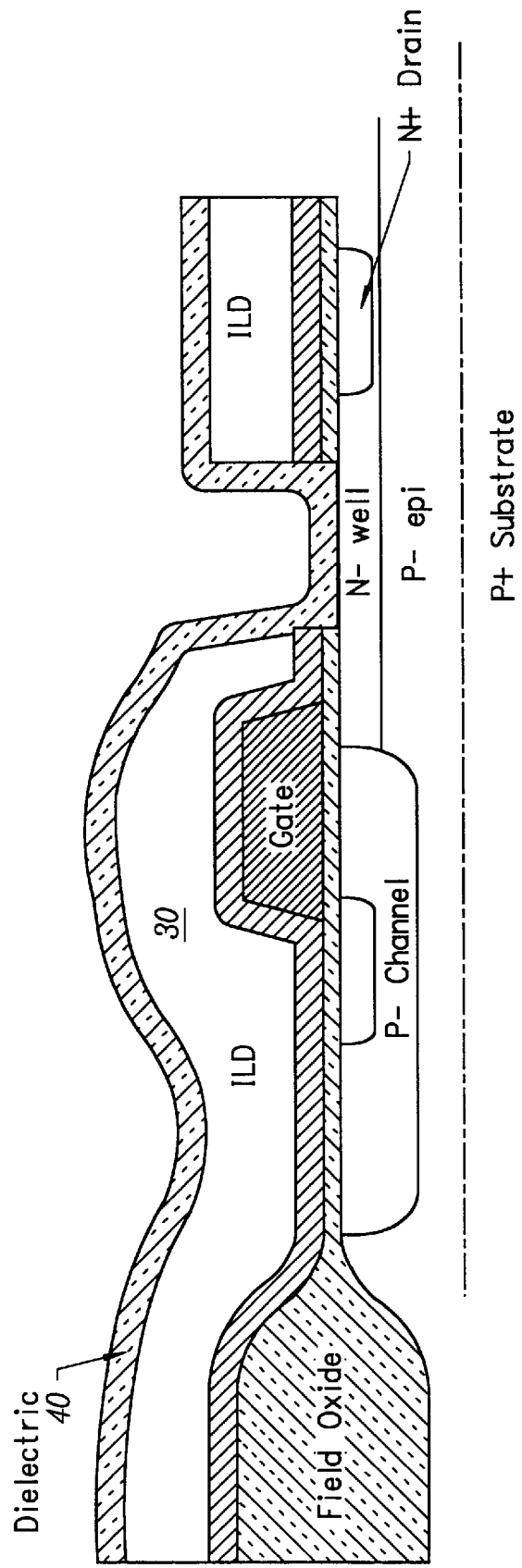
Figure 3C:
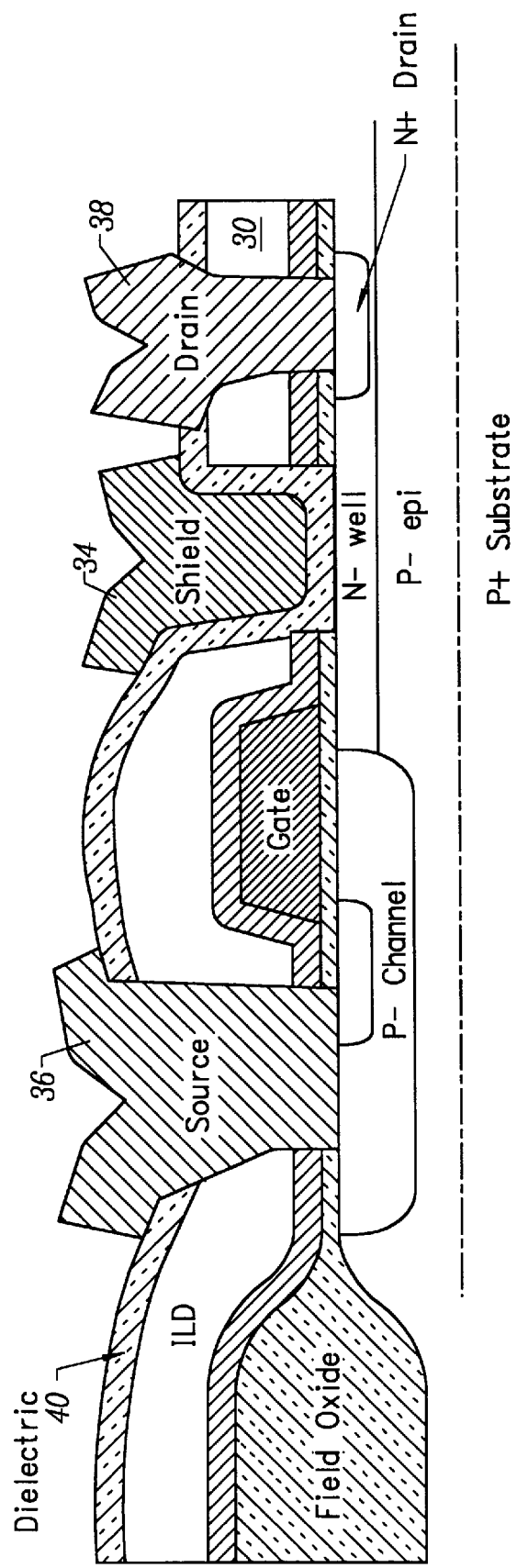

FIGS. 3A–3C illustrate another embodiment of the invention which entails a modification of the process steps 2A and 2B. Rather than leaving the PECVD oxide 24 in the etched recess, as shown in FIG. 2A, layer 24 is removed by etching thereby exposing the surface of the N-well 14. Thereafter, as shown in FIG. 3B, dielectric 40 is deposited over the surface of ILD layer 30 and in the recess over the N-well surface, the dielectric 40 comprising an oxide, oxynitride, or nitride. The thickness of the deposit dielectric 40 can be optimized for a desired gate-drain capacitance. Finally, as shown in FIG. 3C, the shield 34 is deposited in the recess etched over the drain region with the shield metal overlapping the recess and with the dielectric thickness between the shield and drain optimized for desired characteristics.

The resulting MOSFET structure includes a shield between the gate and drain which does not overlap the gate and thereby minimizing any increase of the input capacitance of the device. The recess which receives the shield can be etched to a depth close to the drain-silicon surface without shorting to further reduce the gate-drain feedback capacitance. The shield can be connected to a bias voltage or to the source electrode 36 in a grounded source MOSFET device.

While the invention has been described with reference to specific embodiments in fabricating a lateral DMOS transistor, the description is illustrative of the invention and is not to be construed as limiting the invention. Various modifications of the process and applications in MOSFET structures will be apparent to those skilled in the art without departing from the true spirit and scope of the invention as defined by the appended claims.

Key parameters of the process and resulting structure are the thickness of the dielectric between the shield and the drain region which effects the gate-drain capacitance. However, if the dielectric between the shield and drain is too thin, the breakdown voltage might be reduced.

What is claimed is:

1. A MOSFET device for RF/microwave power applications comprising:

a) a semiconductor body having a major surface, b) a source region and a drain region formed in the major surface and separated by a channel region, c) a gate electrode formed on a gate dielectric over the channel region, d) a first dielectric layer formed over the source region, the drain region, and the gate electrode, e) a second dielectric layer formed over the first dielectric layer, the second dielectric layer being thicker than the first dielectric layer, and f) a shield electrode formed on a third dielectric layer on the major surface between the gate electrode and the drain region.

2. The MOSFET device as defined by claim 1 and further including a source electrode to the source region, and a drain electrode to the drain region.

3. The MOSFET device as defined by claim 1 wherein the first dielectric layer is selected from the group consisting of CVD silicon oxide, LPCVD nitride, and oxynitride.

4. The MOSFET device as defined by claim 3 wherein the second dielectric layer comprises a doped silicon oxide.

5. The MOSFET device as defined by claim 1 wherein the third dielectric and the first dielectric are the same.

6. The MOSFET device as defined by claim 1 wherein the third dielectric is formed directly on said major surface.

* * * * *